(12) United States Patent
Nakamura

(10) Patent No.: US 10,215,808 B2
(45) Date of Patent: Feb. 26, 2019

(54) SCAN TEST CIRCUIT, SCAN TEST METHOD, AND METHOD OF DESIGNING SCAN TEST CIRCUIT

(71) Applicant: MegaChips Corporation, Osaka (JP)

(72) Inventor: Hiroyuki Nakamura, Chiba (JP)

(73) Assignee: MegaChips Corporation, Osaka (JP)

( * ) Notice: Subject to any disclaimer, the term of this patent is extended or adjusted under 35 U.S.C. 154(b) by 73 days.

(21) Appl. No.: 15/411,259

(22) Filed: Jan. 20, 2017

(65) Prior Publication Data

US 2017/0205463 A1   Jul. 20, 2017

(30) Foreign Application Priority Data

Jan. 20, 2016   (JP) .................................. 2016-008448

(51) Int. Cl.
| | |
|---|---|
| *G01R 31/28* | (2006.01) |
| *G01R 31/3185* | (2006.01) |
| *G01R 31/317* | (2006.01) |
| *G01R 31/3177* | (2006.01) |
| *G06F 17/50* | (2006.01) |

(52) U.S. Cl.
CPC . *G01R 31/318536* (2013.01); *G01R 31/3177* (2013.01); *G01R 31/31707* (2013.01); *G01R 31/318541* (2013.01); *G01R 31/318572* (2013.01); *G06F 17/5072* (2013.01); *G06F 17/5077* (2013.01); *G01R 31/318544* (2013.01); *G01R 31/318555* (2013.01)

(58) Field of Classification Search
CPC .... G01R 31/318536; G01R 31/318541; G01R 31/318572; G01R 31/318555; G01R 31/318544; G01R 31/31707; G01R 31/3177; G06F 17/5072; G06F 17/5077

USPC ......................... 714/724, 726, 727, 729, 742
See application file for complete search history.

(56) References Cited

U.S. PATENT DOCUMENTS

| | | | |
|---|---|---|---|
| 6,316,959 B1 | 11/2001 | Onodera | |
| 7,823,034 B2 * | 10/2010 | Wohl | ............. G01R 31/318547 714/726 |
| 7,890,823 B2 | 2/2011 | Anzou | |

(Continued)

FOREIGN PATENT DOCUMENTS

| | | |
|---|---|---|
| JP | 2001-141791 A | 5/2001 |
| JP | 2006-349548 A | 12/2006 |

(Continued)

OTHER PUBLICATIONS

Yuma Ito et al.; "An evaluation of encryption LSI testability against scan based attack"; The Institute of Electronics, Information and Communication Engineers, Technical Report of IEICE; vol. 107, No. 482; pp. 57-62; Feb. 2008 (6 pages).

*Primary Examiner* — Albert Decady
*Assistant Examiner* — Osman M Alshack
(74) *Attorney, Agent, or Firm* — Osha Liang LLP

(57) ABSTRACT

A scan test circuit includes a scan chain formed of a plurality of sub-scan chains, an input distribution circuit, and an output compression circuit. With the use of a bypass circuit, a plurality of sub-scan chains are formed in a compression scan mode by connecting scan cell circuits of a high confidentiality-requiring circuit among a plurality of scan cell circuits included in an internal circuit, and a plurality of sub-scan chains are formed in a non-compression scan mode by bypassing the scan cell circuits of the high confidentiality-requiring circuit.

9 Claims, 5 Drawing Sheets

(56) References Cited

U.S. PATENT DOCUMENTS

| | | | | |
|---|---|---|---|---|
| 2003/0120988 A1* | 6/2003 | Rajski | ............... | G01R 31/31813 714/726 |
| 2004/0237015 A1* | 11/2004 | Abdel-Hafez | ............................. | G01R 31/318572 714/726 |
| 2004/0246337 A1* | 12/2004 | Hasegawa | ....... | G01R 31/318536 348/189 |
| 2008/0288838 A1* | 11/2008 | Anzou | .................... | G11C 29/32 714/726 |
| 2010/0001757 A1* | 1/2010 | Janke | .................... | H01L 23/576 326/16 |
| 2010/0192030 A1* | 7/2010 | Kapur | ............ | G01R 31/318547 714/726 |
| 2011/0258498 A1* | 10/2011 | Chandra | ......... | G01R 31/318536 714/726 |
| 2011/0258501 A1* | 10/2011 | Touba | ............ | G01R 31/318547 714/726 |
| 2011/0289369 A1* | 11/2011 | Lee | ................ | G01R 31/318547 714/726 |
| 2012/0331358 A1* | 12/2012 | Itou | ................ | G01R 31/318547 714/726 |
| 2013/0159800 A1* | 6/2013 | Ravi, Sr. | ............ | G01R 31/3177 714/727 |
| 2013/0173976 A1* | 7/2013 | Tekumalla | ..... | G01R 31/318536 714/726 |

FOREIGN PATENT DOCUMENTS

| | | |
|---|---|---|
| JP | 2008-234782 A | 10/2008 |
| JP | 2008-286553 A | 11/2008 |
| JP | 2013-036903 A | 2/2013 |

* cited by examiner

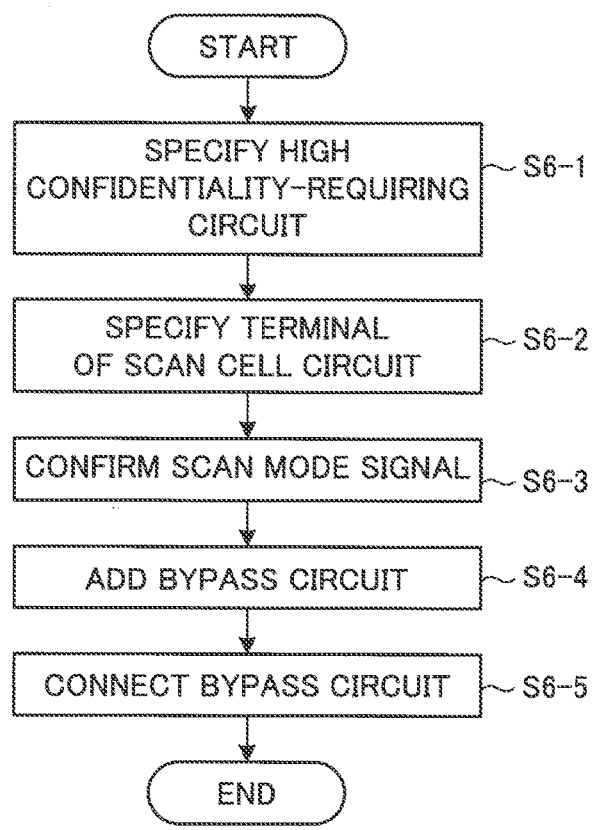

SCAN TEST CIRCUIT, SCAN TEST METHOD, AND METHOD OF DESIGNING SCAN TEST CIRCUIT

CROSS-REFERENCE TO RELATED APPLICATIONS

The present application claims priority under 35 U.S.C. § 119 to Japanese Patent Application No. 2016-008448, filed on Jan. 20, 2016. The above application is hereby expressly incorporated by reference, in its entirety, into the present application.

BACKGROUND OF THE INVENTION

The present invention relates to a scan test circuit and a scan test method for facilitating an internal circuit test in a semiconductor integrated circuit (LSI), and a method of designing the scan test circuit.

A scan test system for performing an LSI internal circuit test using a scan chain has been used in recent LSIs. The scan test system is a system which has high circuit inside observability and is indispensable for easy testing. Generally, however, a problem that a scan test circuit adopting the scan test system is prone to security holes is pointed out due to its high observability.

Such a recent scan test circuit has a compression scan mode in which an output signal is compressed and output, and a non-compression scan mode in which an output signal is output without being compressed. The non-compression scan mode causes a state in which output signal values from scan cell circuits inside a circuit are directly read out to the outside, and hence raises a security issue. On the other hand, in the compression scan mode, output signal values are compressed and hence the severity of a security issue is low.

In general, a high confidentiality-requiring circuit that requires a high degree of confidentiality is excluded from testing using a scan test circuit, and dedicated design for easy testing and shipment testing are separately performed. However, there is another problem in that overhead therefor will occur.

Related art literatures on the scan test circuit include Patent Literature 1 (JP 2001-A), Patent Literature 2 (JP 2008-234782 A), Patent Literature 3 (JP 2008-286553 A), Patent Literature 4 (JP 2013-36903 A), Patent Literature 5 (JP 2006-349548 A), and Non-Patent Literature 1 ("Evaluation of Encryption LSI Testability against Scan Based Attack," Yuma Ito, Masayoshi Yoshimura, Hiroto Yasuura, IEICE technical report, IEICE (The Institute of Electronics, Information and Communication Engineers), February, 2008, Vol. 107, No. 482, pp. 57-62).

Patent Literature 1 describes performing a logical operation on serial data input to a scan path circuit to generate a mode signal, and outputting output data from the scan path circuit as it is or concealing the output data through output of different data depending on the state of the mode signal.

Patent Literature 2 describes that a signal output from a memory storing confidential data is captured in a scan FF chain test circuit to perform a test, and the confidential data is not directly output outside from the test circuit to maintain confidentiality.

Patent Literature 3 describes that a plurality of semiconductor integrated circuits for a compression scan test are included and scan output terminals in the semiconductor integrated circuits for the compressing scan test are sequentially connected to scan input terminals in their succeeding semiconductor integrated circuits to form a single scan test path.

Patent Literature 4 describes narrowing down failure candidate scan flip-flops based on test results in both a test pattern for scan chain failure diagnosis in a bypass test mode and a scan chain test pattern in a compression test mode, comparing with the test results using the scan chain test pattern in the compression test mode, and specifying a failure scan chain in the compression test mode based on a difference between a scan chain structure in the compression test mode and that in the bypass test mode.

Patent Literature 5 describes comparing the output response between scan paths to inspect the scan paths themselves for failure.

Non-Patent Literature 1 describes constructing an FF which is not to be controlled or observed by a non-scan FF to which controllability and observability are both not added, and constructing an FF which may both be controlled and observed by a normal scan FF to which controllability and observability are added. Non-Patent Literature 1 also describes adding only controllability to an FF which is not to be observed but may be controlled, and on the other hand, adding only observability to an FF which is not to be controlled but may be observed.

SUMMARY OF INVENTION

However, the process in Patent Literature 1 requires a compression circuit or an encryption circuit exclusively used for a high confidentiality-requiring circuit, and hence has considerable overhead, for example, in terms of processing of control circuits and an increase in circuit area.

Further, the process in Patent Literature 2 is used for a memory storing confidential data, and Patent Literature 3 is not directed to testing of a high confidentiality-requiring circuit.

Each of Patent Literatures 4 and 5 includes a non-compression scan mode and a compression scan mode but is directed to failure analysis, not to testing of a high confidentiality-requiring circuit.

In Non-Patent Literature 1, a compression scan mode is not included, and hence the overhead is considerable, for example, in terms of processing of control circuits and an increase in pattern length.

An object of the present invention is to solve the related art problems and to provide a scan test circuit and a scan test method capable of testing while protecting the confidentiality of a high confidentiality-requiring circuit and minimizing an increase in overhead, and a method of designing the scan test circuit.

In order to achieve the above-mentioned object, the present invention provides a scan test circuit comprising: a scan chain which comprises a plurality of sub-scan chains formed by connecting respective scan cell circuits in series among a plurality of scan cell circuits included in an internal circuit when a scan enable signal is set to a scan test mode and a scan mode signal is set to a compression scan mode, and which is formed by connecting the plurality of sub-scan chains in series when the scan enable signal is set to the scan test mode and the scan mode signal is set to a non-compression scan mode;

an input distribution circuit which is configured, in the compression scan mode, to input a scan-in signal to be distributed as a distribution signal to a scan-in input terminal in each of scan cell circuits respectively positioned first in the plurality of sub-scan chains, and which is configured, in the non-compression scan mode, to input the scan-in signal to a scan-in input terminal of a scan cell circuit positioned first in a first sub-scan chain, and to sequentially input an output signal from a scan cell circuit positioned last in a preceding sub-scan chain to a scan-in input terminal of a scan cell circuit positioned first in its succeeding sub-scan chain; and an output compression circuit which is configured to output, in the compression scan mode, a compression signal obtained by compressing output signals from scan cell circuits respectively positioned last in the plurality of sub-scan chains as a scan-out signal, and to output, in the non-compression scan mode, an output signal from a scan cell circuit positioned last in a final sub-scan chain as the scan-out signal;

wherein the scan chain comprises a bypass circuit which is configured in the compression scan mode to connect scan cell circuits of a high confidentiality-requiring circuit specified based on information on the high confidentiality-requiring circuit among the plurality of scan cell circuits included in the internal circuit, thereby forming the plurality of sub-scan chains, and which is configured in the non-compression scan mode to bypass the scan cell circuits of the high confidentiality-requiring circuit to form the plurality of sub-scan chains.

The present invention also provides a scan test method for performing a scan test of an internal circuit using a scan test circuit having a scan test mode including a compression scan mode and a non-compression scan mode, the scan test method comprising:

a step of setting the scan test mode to the compression scan mode and forming a scan chain with a plurality of sub-scan chains formed by connecting respective scan cell circuits in series among a plurality of scan cell circuits included in the internal circuit;

a step of performing the scan test of the internal circuit using the plurality of sub-scan chains and outputting a compression signal obtained by compressing output signals from the plurality of sub-scan chains as a test result;

a step of setting the scan test mode to the non-compression scan mode, forming the plurality of sub-scan chains through connection in which scan cell circuits of a high confidentiality-requiring circuit specified by information on the high confidentiality-requiring circuit are bypassed among the plurality of scan cell circuits included in the internal circuit, and forming the scan chain through serial connection of the plurality of sub-scan chains; and a step of performing the scan test of the internal circuit except the high confidentiality-requiring circuit using the scan chain, and outputting an output signal from the scan chain as the test result.

The present invention further provides a scan test circuit-designing method comprising:

a step of substituting a plurality of flip-flops included in an internal circuit with a plurality of scan cell circuits;

a step of connecting a scan enable signal to a scan enable input terminal in each of the plurality of scan cell circuits and sequentially connecting an output signal from a preceding scan cell circuit to a scan-in input terminal of its succeeding scan cell circuit, thereby forming a scan chain through serial connection of the plurality of scan cell circuits when the scan enable signal is set to a scan test mode;

a step of dividing the plurality of scan cell circuits making up the scan chain to form a plurality of sub-scan chains;

a step of adding an input distribution circuit which is configured to input a scan-in signal to be distributed as a distribution signal to a scan-in input terminal in each of scan cell circuits respectively positioned first in the plurality of sub-scan chains when a scan mode signal is set to a compression scan mode, and which is configured to input the scan-in signal to a scan-in input terminal in a scan cell circuit positioned first in a first sub-scan chain and to sequentially input an output signal from a scan cell circuit positioned last in a preceding sub-scan chain to a scan-in input terminal of a scan cell circuit positioned first in its succeeding sub-scan chain when the scan mode signal is set to a non-compression scan mode;

a step of connecting the scan-in signal and the scan mode signal to the input distribution circuit, and connecting an output signal from the input distribution circuit to the scan-in input terminal in each of the scan cell circuits respectively positioned first in the plurality of sub-scan chains;

a step of adding an output compression circuit which is configured to output, in the compression scan mode, a compression signal obtained by compressing output signals from scan cell circuits respectively positioned last in the plurality of sub-scan chains as a scan-out signal, and to output, in the non-compression scan mode, an output signal from a scan cell circuit positioned last in a final sub-scan chain as the scan-out signal;

a step of connecting the scan-out signal and the scan mode signal to the output compression circuit, and connecting the output signals from the scan cell circuits respectively positioned last in the plurality of sub-scan chains to the output compression circuit;

a step of specifying a high confidentiality-requiring circuit in the internal circuit based on information on the high confidentiality-requiring circuit;

a step of adding a bypass circuit which is configured in the compression scan mode to connect scan cell circuits of the high confidentiality-requiring circuit to form the plurality of sub-scan chains, and which is configured in the non-compression scan mode to bypass the scan cell circuits of the high confidentiality-requiring circuit and to connect an output signal from a circuit preceding a scan cell circuit positioned first in the high confidentiality-requiring circuit to a circuit succeeding a scan cell circuit positioned last in the high confidentiality-requiring circuit, thus forming the plurality of sub-scan chains; and a step of connecting the output signal from the circuit preceding the scan cell circuit positioned first in the high confidentiality-requiring circuit, an output signal from the scan cell circuit positioned last in the high confidentiality-requiring circuit, and the scan mode signal to the bypass circuit, and connecting an output signal from the bypass circuit to the circuit succeeding the scan cell circuit positioned last in the high confidentiality-requiring circuit. confidentiality-requiring circuit.

According to the invention, in the non-compression scan mode, a scan test is performed by bypassing scan cell circuits of a high confidentiality-requiring circuit, and hence the confidentiality of the high confidentiality-requiring circuit can be protected.

Further, according to the invention, in the compression scan mode, a scan test is performed by connecting the scan cell circuits of the high confidentiality-requiring circuit, and hence a high degree of test quality (high degree of failure detection) can be maintained as compared to cases where the high confidentiality-requiring circuit is completely excluded from testing.

Further, according to the invention, existing input distribution circuit and output compression circuit are used as they are to test the high confidentiality-requiring circuit in the compression scan mode. In other words, test results of the internal circuit are compressed and output to realize the confidentiality of the high confidentiality-requiring circuit. Therefore, overhead due to addition of control circuits, an increase in circuit area, and an increase in pattern length can be minimized.

BRIEF DESCRIPTION OF THE DRAWINGS

FIG. 5 is a flow chart of an embodiment representing a process corresponding to a high confidentiality-requiring circuit.

DETAILED DESCRIPTION OF THE INVENTION

On the following pages, a scan test circuit, a scan test method, and a scan test circuit-designing method according to the invention are described in detail with reference to a preferred embodiment shown in the accompanying drawings.

Figure 1A:
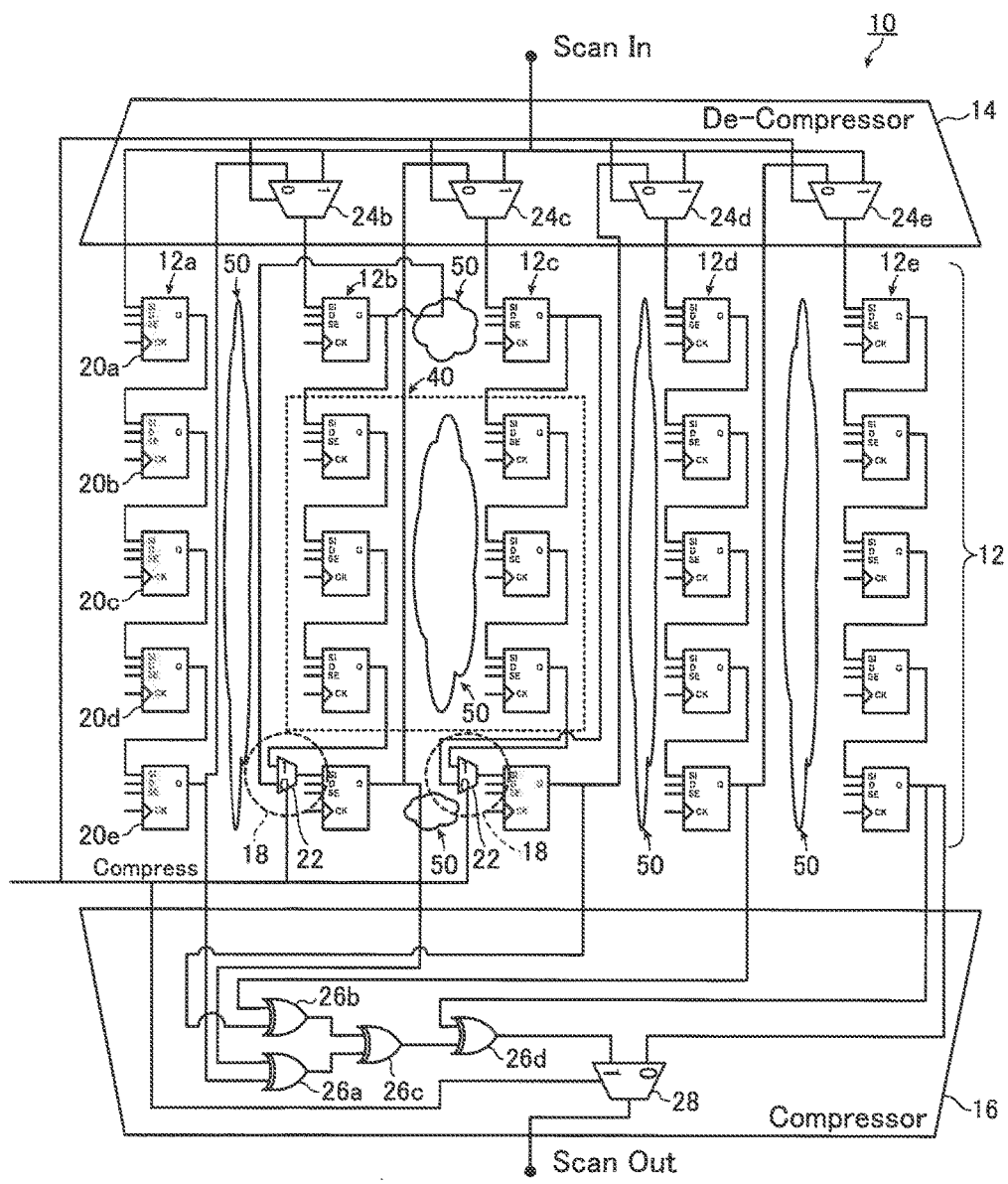
FIG. 1A is a circuit diagram of an embodiment representing a configuration of a scan test circuit according to the invention.

FIG. 1A is a circuit diagram of an embodiment representing a configuration of a scan test circuit according to the invention. A scan test circuit 10 illustrated in FIG. 1A is configured to facilitate an LSI internal circuit test and includes a scan chain 12, an input distribution circuit 14, and an output compression circuit 16.

The internal circuit includes combinational circuits and scan cell circuits. Further, in this embodiment, the internal circuit includes circuits which do not require a high degree of confidentiality, and a high confidentiality-requiring circuit which is specified based on information on the high confidentiality-requiring circuit which requires a high degree of confidentiality. In FIG. 1A, the internal circuit has in a region surrounded by a dotted line a high confidentiality-requiring circuit 40, which includes a combinational circuit 50 and scan cell circuits 20 (20b, 20c, 20d). The internal circuit has, in the other part, circuits which do not require a high degree of confidentiality.

The scan test circuit 10 has a normal operation mode and a scan test mode which are set by a scan enable signal. The scan test circuit 10 is in the normal operation mode when the scan enable signal is at a low level, and in the scan test mode when the scan enable signal is at a high level.

Further, the scan test mode has a compression scan mode and a non-compression scan mode which are set by a scan mode signal (Compress). The non-compression scan mode is applied when the scan mode signal is at a low level, and the compression scan mode is applied when the scan mode signal is at a high level.

The scan test mode is a mode for performing an internal circuit scan test, and the normal operation mode is a mode which allows the internal circuit to normally operate based on an input signal at the time of normal operation. The compression scan mode is a mode in which scan test results as output signals from a plurality of sub-scan chains are compressed and output, and the non-compression scan mode is a mode in which a scan test result as an output signal from the scan chain is output without being compressed.

In the scan test circuit 10, when the scan enable signal is set to the scan test mode, the scan chain 12 forms a shift register through serial connection of the plurality of scan cell circuits included in the internal circuit. In this embodiment, the scan chain 12 includes five sub-scan chains 12a, 12b, 12c, 12d and 12e, and bypass circuits 18.

Figure 1B:
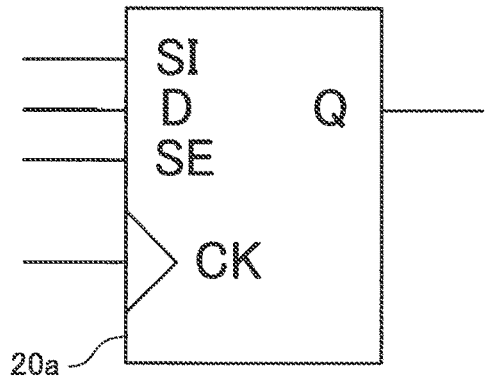
FIG. 1B is an enlarged diagram of a scan cell circuit illustrated in FIG. 1A.

The first (first-stage) sub-scan chain 12a includes five scan cell circuits 20a, 20b, 20c, 20d, and 20e contained in the internal circuit. An enlarged diagram of the scan cell circuit 20a typically selected from among the scan cell circuits 20a, 20b, 20c, 20d, and 20e is illustrated in FIG. 1B.

An input signal at the time of normal operation, such as an input signal input from outside or an output signal from the preceding combinational circuit 50 included in the internal circuit, is input to a data input terminal D of each of the scan cell circuits 20a, 20b, 20c, 20d, and 20e. Further, a scan enable signal is input to a scan enable input terminal SE and a clock signal is input to a clock input terminal CK in each of the scan cell circuits 20a, 20b, 20c, 20d, and 20e.

A scan-in signal (distribution signal) is input from the input distribution circuit 14 to a scan-in input terminal SI of each first scan cell circuit 20a. Further, output signals output from data output terminals Q of the preceding scan cell circuits 20a, 20b, 20c, and 20d are input to scan-in input terminals SI of their corresponding second to final (fifth) scan cell circuits 20b, 20c, 20d, and 20e, respectively.

Although not illustrated, output signals from the scan cell circuits 20a, 20b, 20c, 20d, and 20e in the sub-scan chains 12a, 12b, 12c, and 12d are input to their succeeding combinational circuits 50 included in the internal circuit, respectively. Output signals from the combinational circuits 50 are input to the data input terminals D of the scan cell circuits 20a, 20b, 20c, 20d, and 20e in their succeeding sub-scan chains 12b, 12c, 12d, and 12e, respectively.

When the scan enable signal is set to the normal operation mode, input signals at the time of normal operation are output in synchronization with clock signals from the scan cell circuits 20a, 20b, 20c, 20d, and 20e of the sub-scan chain 12a, respectively, and when the scan enable signal is set to the scan test mode, a scan-in signal and output signals from the preceding scan cell circuits 20a, 20b, 20c, and 20d are output in synchronization with clock signals, respectively.

The second sub-scan chain 12b further includes the bypass circuit 18 which is not included in the first sub-scan chain 12a. In this embodiment, the bypass circuit 18 is composed of a multiplexer 22.

Output signals from the first scan cell circuit 20a and the fourth scan cell circuit 20d are input to input terminals 0 and 1 of the multiplexer 22, respectively, and a scan mode signal is input to a selection input terminal of the multiplexer 22. Further, an output signal output from the multiplexer 22 is input to the scan-in input terminal SI of the final scan cell circuit 20e.

When the scan mode signal is set to the compression scan mode, the output signal from the fourth scan cell circuit 20d is output from the multiplexer 22, and when the scan mode signal is set to the non-compression scan mode, the output signal from the first scan cell circuit 20a is output from the multiplexer 22.

In other words, in the compression scan mode, the bypass circuit 18 forms the sub-scan chain 12b through connection of the scan cell circuits 20b, 20c, and 20d of the high confidentiality-requiring circuit 40 selected from among the plurality of scan cell circuits included in the internal circuit. Further, in the non-compression scan mode, the scan cell circuits 20b, 20c, and 20d of the high confidentiality-requiring circuit 40 are bypassed and the output signal from the circuit preceding the scan cell circuit 20b positioned first in the high confidentiality-requiring circuit 40 (first scan cell circuit 20a in the example of FIG. 1A) is connected to the circuit succeeding the scan cell circuit 20d positioned last in the high confidentiality-requiring circuit 40 (final scan cell circuit 20e in the example of FIG. 1A), thereby forming the sub-scan chain 12b.

The third sub-scan chain 12c is configured in the same manner as the second sub-scan chain 12b, whereas the fourth sub-scan chain 12d and the final sub-scan chain 12e are configured in the same manner as the first sub-scan chain 12a.

In other words, in the scan test mode and the compression scan mode, the scan chain 12 includes the plurality of sub-scan chains formed by connecting the respective scan cell circuits in series so as to include the scan cell circuits of the high confidentiality-requiring circuit among the plurality of scan cell circuits included in the internal circuit. In contrast, in the scan test mode and the non-compression scan mode, the scan cell circuits of the high confidentiality-requiring circuit are bypassed to form the plurality of sub-scan chains, which are connected in series to form the scan chain 12.

Subsequently, in the compression scan mode, the input distribution circuit (De-Compressor) 14 distributes scan-in signals (Scan In) to the five sub-scan chains 12a, 12b, 12c, 12d, and 12e. In this embodiment, the input distribution circuit 14 includes four multiplexers 24b, 24c, 24d, and 24e.

The scan-in signal is input from the input distribution circuit 14 to the scan-in input terminal SI of the first scan cell circuit 20a of the first sub-scan chain 12a.

Output signals from the final scan cell circuits 20e of the preceding sub-scan chains 12a, 12b, 12c, and 12d are input to input terminals 0 of the multiplexers 24b, 24c, 24d, and 24e, respectively, and scan-in signals are input to input terminals 1 of the multiplexers 24b, 24c, 24d, and 24e, respectively. Scan mode signals are input to selection input terminals of the multiplexers 24b, 24c, 24d, and 24e, respectively, and output signals therefrom are input to the scan-in input terminals SI of the first scan cell circuits 20a of their corresponding sub-scan chains 12b, 12c, 12d, and 12e, respectively.

In the compression scan mode, scan-in signals are output as distribution signals from the multiplexers 24b, 24c, 24d, and 24e, respectively, and in the non-compression scan mode, output signals from the final scan cell circuits 20e of the preceding sub-scan chains 12a, 12b, 12c, and 12d are output from the multiplexers 24b, 24c, 24d, and 24e, respectively.

In other words, in the compression scan mode, scan-in signals to be distributed as distribution signals are input from the input distribution circuit 14 to the scan-in input terminals SI of the first scan cell circuits 20a of the five sub-scan chains 12a, 12b, 12c, 12d, and 12e, respectively. In contrast, in the non-compression scan mode, a scan-in signal is input from the input distribution circuit 14 to the scan-in input terminal SI of the first scan cell circuit 20a in the first sub-scan chain 12a, and output signals from the final scan cell circuits 20e of the sub-scan chains 12a, 12b, 12c, and 12d are sequentially input from the input distribution circuit 14 to the scan-in input terminals SI of the first scan cell circuits 20a of the succeeding sub-scan chains 12b, 12c, 12d, and 12e, respectively.

Finally, in the compression scan mode, the output compression circuit (Compressor) 16 compresses output signals from the five sub-scan chains 12a, 12b, 12c, 12d, and 12e, and outputs a compression signal. In this embodiment, the output compression circuit 16 includes four EXOR circuits 26a, 26b, 26c and 26d, and a multiplexer 28.

Output signals from the final scan cell circuits 20e of the first and second sub-scan chains 12a and 12b are input to the EXOR circuit 26a, and output signals from the final scan cell circuits 20e of the third and fourth sub-scan chains 12c and 12d are input to the EXOR circuit 26b. Further, output signals from the EXOR circuits 26a and 26b are input to the EXOR circuit 26c. An output signal from the EXOR circuit 26c, and an output signal from the final scan cell circuit 20e of the final sub-scan chain 12e are input to the EXOR circuit 26d.

The output signals from the five sub-scan chains 12a, 12b, 12c, 12d, and 12e are compressed by the EXOR circuits 26a, 26b, 26c, and 26d, and a compression signal is output from the EXOR circuit 26d.

The output signal from the final scan cell circuit 20e of the final sub-scan chain 12e is input to an input terminal 0 of the multiplexer 28, and the output signal from the EXOR circuit 26d is input to an input terminal 1 of the multiplexer 28. Further, a scan mode signal is input to a selection input terminal of the multiplexer 28. A scan-out signal (Scan Out) is output from the multiplexer 28.

In the compression scan mode, the output signal from the EXOR circuit 26d, namely, the compression signal is output from the multiplexer 28, and in the non-compression scan mode, the output signal from the final scan cell circuit 20e of the final sub-scan chain 12e is output from the multiplexer 28.

In other words, in the compression scan mode, the output compression circuit 16 outputs, as the scan-out signal, the compression signal obtained by compressing the output signals from the final scan cell circuits 20e in the five sub-scan chains 12a, 12b, 12c, 12d, and 12e. In contrast, in the non-compression scan mode, the output compression circuit 16 outputs, as the scan-out signal, the output signal from the final scan cell circuit 20e of the final sub-scan chain 12e, in other words, the output signal from the final scan cell circuit 20e of the scan chain 12.

Next, the operation of the scan test circuit 10 is described.

When a normal operation is to be performed, a scan enable signal is set to the normal operation mode.

In the normal operation mode, all the scan cell circuits included in the internal circuit hold input signals at the time of normal operation in synchronization with clock signals. In other words, the scan chain 12 is not formed.

The internal circuit thus normally operates based on the input signals at the time of normal operation.

When a scan test is to be performed, the scan enable signal is first set to the scan test mode (shift mode), is subsequently set to the normal operation mode (capture mode), and is set to the scan test mode (shift mode) again.

Further, in the scan test mode, the scan test circuit 10 operates in the non-compression scan mode or the compression scan mode.

Next, the operation of the scan test circuit 10 in the non-compression scan mode is described.

In the non-compression scan mode, a scan enable signal is first set to the scan test mode (shift mode).

In this case, output signals from the final scan cell circuits 20e of the preceding sub-scan chains 12a, 12b, 12c, and 12d are output from the multiplexers 24b, 24c, 24d, and 24e of the input distribution circuit 14, respectively.

In other words, a scan-in signal is input from the input distribution circuit 14 to the scan-in input terminal SI of the first scan cell circuit 20a in the first sub-scan chain 12a; and the output signals from the multiplexers 24b, 24c, 24d, and 24e, namely, the output signals from the final scan cell circuits 20e of the preceding sub-scan chains 12a, 12b, 12c, and 12d are input from the input distribution circuit 14 to the scan-in input terminals SI of the first scan cell circuits 20a in the second to final sub-scan chains 12b, 12c, 12d, and 12e, respectively.

The five sub-scan chains 12a, 12b, 12c, 12d, and 12e are thus connected in series to form the scan chain 12.

Output signals from the first scan cell circuits 20a of the second and third sub-scan chains 12b and 12c are output from the multiplexers 22 that make up the bypass circuits 18 of the second and third sub-scan chains 12b and 12c, respectively.

The scan cell circuits 20b, 20c, and 20d in the high confidentiality-requiring circuit 40 are thus bypassed to form the sub-scan chains 12b and 12c.

An output signal from the final scan cell circuit 20e of the final sub-scan chain 12e is output from the multiplexer 28 of the output compression circuit 16.

In the non-compression scan mode, clock signals and scan-in signals whose numbers correspond to 19 obtained by subtracting the total number (i.e., 6) of the scan cell circuits 20b, 20c, and 20d in the high confidentiality-requiring circuit 40 from the total number (i.e., 25) of all the scan cell circuits making up the scan chain 12 are sequentially input.

The first scan cell circuit in the scan chain 12 (the first scan cell circuit 20a of the first sub-scan chain 12a) sequentially holds scan-in signals input to the scan-in input terminal SI in synchronization with clock signals, and the succeeding scan cell circuits in the scan chain sequentially hold output signals from the preceding scan cell circuits in synchronization with clock signals, respectively.

The scan-in signals are thus sequentially shifted from the first scan cell circuit of the scan chain 12 to the succeeding scan cell circuits, whereby a test pattern is set on the scan chain 12.

The combinational circuits 50 included in the internal circuit operate based on the test pattern set on the scan chain 12, and test results of a scan test are output from the combinational circuits 50.

Subsequently, the scan enable signal is set to the normal operation mode (capture mode).

In this case, the scan chain 12 is not formed but all the scan cell circuits included in the internal circuit hold output signals (test results) from the preceding combinational circuits 50 in synchronization with clock signals.

The test results are thus stored in all the scan cell circuits included in the internal circuit.

Subsequently, the scan enable signal is set to the scan test mode (shift mode) again.

In this case, the scan test circuit 10 is configured as described above, and clock signals whose number corresponds to the total number (i.e., 19) of the scan cell circuits making up the scan chain are likewise sequentially input.

As above, the first scan cell circuit in the scan chain 12 sequentially holds scan-in signals input to the scan-in input terminal SI in synchronization with clock signals, and the succeeding scan cell circuits in the scan chain sequentially hold output signals from the preceding scan cell circuits in synchronization with clock signals, respectively.

The test results held in the scan cell circuits of the scan chain 12 are thus sequentially shifted from the first scan cell circuit of the scan chain 12 to the succeeding scan cell circuits, and are sequentially output from the final scan cell circuit (final scan cell circuit 20e of the final sub-scan chain 12e).

The output signals from the final scan cell circuit of the scan chain 12 are sequentially output as scan-out signals from the multiplexer 28 of the output compression circuit 16.

In the non-compression scan mode, the five sub-scan chains 12a, 12b, 12c, 12d, and 12e are thus connected in series to form the scan chain 12. In the non-compression scan mode, the scan cell circuits 20b, 20c, and 20d of the high confidentiality-requiring circuit 40 are bypassed to perform a scan test, and hence the confidentiality of the high confidentiality-requiring circuit 40 can be protected.

In other words, whether the sub-scan chain is formed through connection with the high confidentiality-requiring circuit 40 or through bypass of the high confidentiality-requiring circuit 40 is automatically switched by the multiplexer 22 of each bypass circuit 18 based on the scan mode signal connected by physical wiring, and in the non-compression scan mode, it is not possible to freely switch through an operation from outside whether the high confidentiality-requiring circuit 40 is to be connected or bypassed.

Therefore, a scan test circuit product after manufacture has such a structure that does not allow an access to the high confidentiality-requiring circuit 40 from outside in the non-compression scan mode, and hence the confidentiality of the high confidentiality-requiring circuit 40 can be protected.

Next, the operation of the scan test circuit 10 in the compression scan mode is described.

Also in the compression scan mode, a scan enable signal is first set to the scan test mode (shift mode).

In this case, scan-in signals to be distributed as distribution signals are output from the multiplexers 24b, 24c, 24d, and 24e of the input distribution circuit 14, respectively.

In other words, a scan-in signal (distribution signal) is input from the input distribution circuit 14 to the scan-in input terminal SI of the first scan cell circuit 20a in the first sub-scan chain 12a; and output signals from the multiplexers 24b, 24c, 24d, and 24e, namely, distribution signals are input from the input distribution circuit 14 to the scan-in input terminals SI of the second to final sub-scan chains 12b, 12c, 12d, and 12e, respectively.

The five sub-scan chains 12a, 12b, 12c, 12d, and 12e are thus not connected in series but are individually formed.

Further, output signals from the fourth scan cell circuits 20d are output from the multiplexers 22 that make up the bypass circuits 18 of the second and third sub-scan chains 12b and 12c, respectively.

The scan cell circuits 20b, 20c, and 20d in the high confidentiality-requiring circuit 40 are thus connected to form the sub-scan chains 12b and 12c, whereby the five scan cell circuits 20a, 20b, 20c, 20d, and 20e are connected in series.

An output signal from the EXOR circuit 26d, namely, a compression signal which is compressed in the EXOR circuits 26a, 26b, 26c, and 26d through calculation of EXOR (exclusive OR) of the output signals from the final scan cell circuits 20e of the five sub-scan chains 12a, 12b, 12c, 12d, and 12e is output from the multiplexer 28 of the output compression circuit 16.

In the compression scan mode, clock signals and scan-in signals whose numbers correspond to the total number (i.e., 5) of all the scan cell circuits 20a, 20b, 20c, 20d, and 20e making up each of the sub-scan chains 12a, 12b, 12c, 12d, and 12e are sequentially input.

The first scan cell circuit 20a of the sub-scan chain 12a sequentially holds scan-in signals input to the scan-in input terminal SI in synchronization with clock signals, and the first scan cell circuits 20a in the second to final sub-scan chains 12b, 12c, 12d, and 12e sequentially hold output signals from the multiplexers 24b, 24c, 24d, and 24e of the input distribution circuit 14, namely, distribution signals in synchronization with clock signals, respectively.

Further, the second to final scan cell circuits 20b, 20c, 20d, and 20e of the sub-scan chains 12a, 12b, 12c, 12d, and 12e sequentially hold output signals from the preceding scan cell circuits 20a, 20b, 20c and 20d in synchronization with clock signals, respectively.

The scan-in signal and the distribution signals are thus sequentially shifted from the first scan cell circuits 20a of the sub-scan chain 12a, and of the sub-scan chains 12b, 12c, 12d, and 12e to the succeeding scan cell circuits 20b, 20c, 20d, and 20e, respectively, whereby a test pattern is set on the sub-scan chains 12a, 12b, 12c, 12d, and 12e.

The respective combinational circuits 50 included in the internal circuit operate based on the test pattern set on the sub-scan chains 12a, 12b, 12c, 12d, and 12e, and test results of a scan test are output from the combinational circuits 50.

Subsequently, the scan enable signal is set to the normal operation mode (capture mode).

In this case, the sub-scan chains 12a, 12b, 12c, 12d, and 12e are not formed but all the scan cell circuits included in the internal circuit hold the output signals (test results) from the preceding combinational circuits 50 in synchronization with clock signals, respectively.

The test results are thus stored in all the scan cell circuits included in the internal circuit.

Subsequently, the scan enable signal is set to the scan test mode (shift mode) again.

In this case, the scan test circuit 10 is configured as described above, and clock signals whose number corresponds to the total number (i.e., 5) of the scan cell circuits making up each of the sub-scan chains 12a, 12b, 12c, 12d, and 12e are likewise sequentially input.

As above, the first scan cell circuits 20a in the sub-scan chain 12a and the sub-scan chains 12b, 12c, 12d, and 12e sequentially hold a scan-in signal and distribution signals in synchronization with clock signals, respectively, and the succeeding scan cell circuits 20b, 20c, 20d, and 20e in the sub-scan chains 12a, 12b, 12c, 12d, and 12e sequentially hold output signals from the preceding scan cell circuits 20a, 20b, 20c, and 20d in synchronization with clock signals, respectively.

The test results held in the scan cell circuits 20a, 20b, 20c, 20d, and 20e of the sub-scan chains 12a, 12b, 12c, 12d, and 12e are thus sequentially shifted from the first scan cell circuits 20a of the sub-scan chains 12a, 12b, 12c, 12d, and 12e to the succeeding scan cell circuits, and are sequentially output from the final scan cell circuits 20e, respectively.

Further, the test results output from the final scan cell circuits 20e of the five sub-scan chains 12a, 12b, 12c, 12d, and 12e are compressed by the EXOR circuits 26a, 26b, 26c, and 26d of the output compression circuit 16 to be output as a compression signal, and the output signal from the EXOR circuit 26d, in other words, the compression signal is sequentially output as the scan-out signal from the multiplexer 28.

In the compression scan mode, the five sub-scan chains 12a, 12b, 12c, 12d, and 12e are thus formed as the scan chain 12. In the compression scan mode, a scan test is performed by connecting the scan cell circuits 20b, 20c, and 20d of the high confidentiality-requiring circuit 40, and hence a high degree of test quality (high degree of failure detection) can be maintained as compared to cases where the high confidentiality-requiring circuit 40 is completely excluded from testing.

In general, in the scan test circuit, all the scan cell circuits included in the internal circuit are connected together to form the scan chain. Further, the compression scan mode and the non-compression scan mode are provided based on the configuration of the scan chain 12.

Further, in the non-compression scan mode, the scan test is performed in a structure obtained by dividing all the scan cell circuits included in the internal circuit by the number of sets of scan-in signals and scan-out signals given to the internal circuit, averaging, and connecting the respective divided scan cell circuits in series. Therefore, the scan chain includes a very large number, for example, several tens of thousands of scan cell circuits, which is a factor that may lengthen the test pattern.

In contrast, in the compression scan mode, the scan chain in the non-compression scan mode is further divided into sub-scan chains each including about several hundreds of scan cell circuits to perform the scan test. In dividing into sub-scan chains, for example, an input distribution circuit and an output compression circuit provided for each EDA (Electronic Design Automation) vendor are used, which is a factor capable of shortening the test pattern.

The compression scan mode has a merit in shortening the test pattern. However, portions where a failure cannot be detected remain due to, for example, the compressed structure. Therefore, the fault coverage to be ultimately achieved is reduced, and there is also a demerit in that debugging and failure analysis during shipment and sorting of products are laborious because it is difficult to specify a defective area also due to the compressed structure.

Therefore, both the non-compression scan mode and the compression scan mode are generally used. In recent years, demerits in the compression scan mode are positively reduced by improvement of the compressed structure, and some EDA vendors advocate that the non-compression scan mode is not necessary. However, as described above, the non-compression scan mode is effective in debugging or the like, and hence both the non-compression scan mode and the compression scan mode are usually mounted under the present circumstances.

Further, the multiplexers 22 are inserted as the bypass circuits 18 in the scan test circuit 10 according to this embodiment, but this hardly affects the layout and wiring.

Further, in the scan test circuit 10, existing circuits provided by an EDA vendor are used as they are for the input distribution circuit 14 and the output compression circuit 16 to test the high confidentiality-requiring circuit 40 in the compression scan mode. In other words, test results of the internal circuit are compressed and output to realize the confidentiality of the high confidentiality-requiring circuit 40. Therefore, overhead due to addition of control circuits, an increase in circuit area, and an increase in pattern length can be minimized.

Next, a conventional scan test circuit-designing method is first described prior to describing a scan test circuit-designing method according to the invention.

Figure 2:
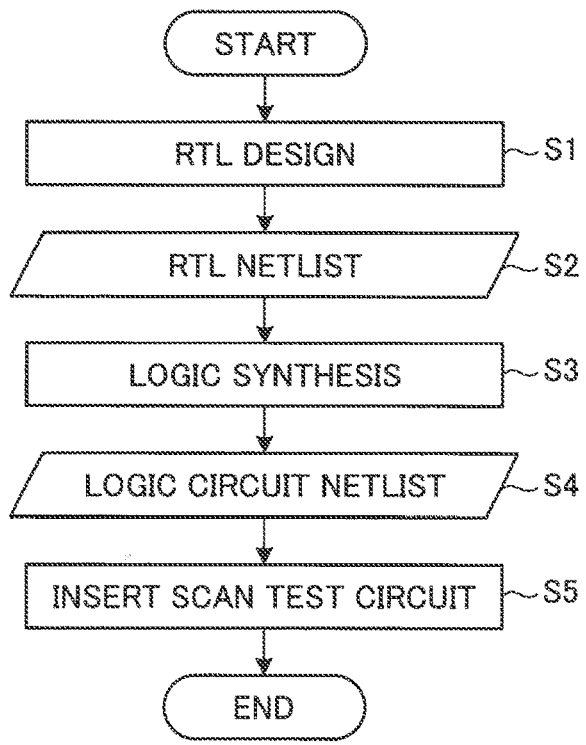
FIG. 2 is an exemplary flow chart representing a conventional scan test circuit-designing method.

FIG. 2 is an exemplary flow chart representing a conventional scan test circuit-designing method. As illustrated in the flow chart of FIG. 2, according to the conventional scan test circuit design, a hardware description language is first used to describe an RTL (Register Transfer Level) circuit through RTL design (Step S1) and an RTL netlist is generated from the description of the RTL circuit (Step S2).

Subsequently, a logic synthesis tool is used to perform logic synthesis based on the RTL netlist (Step S3) and a netlist of a logic circuit (internal circuit) including flip-flops and combinational circuits is generated (Step S4).

Finally, a test circuit insertion tool is used to insert a scan test circuit based on the netlist of the logic circuit (Step S5).

Figure 3:
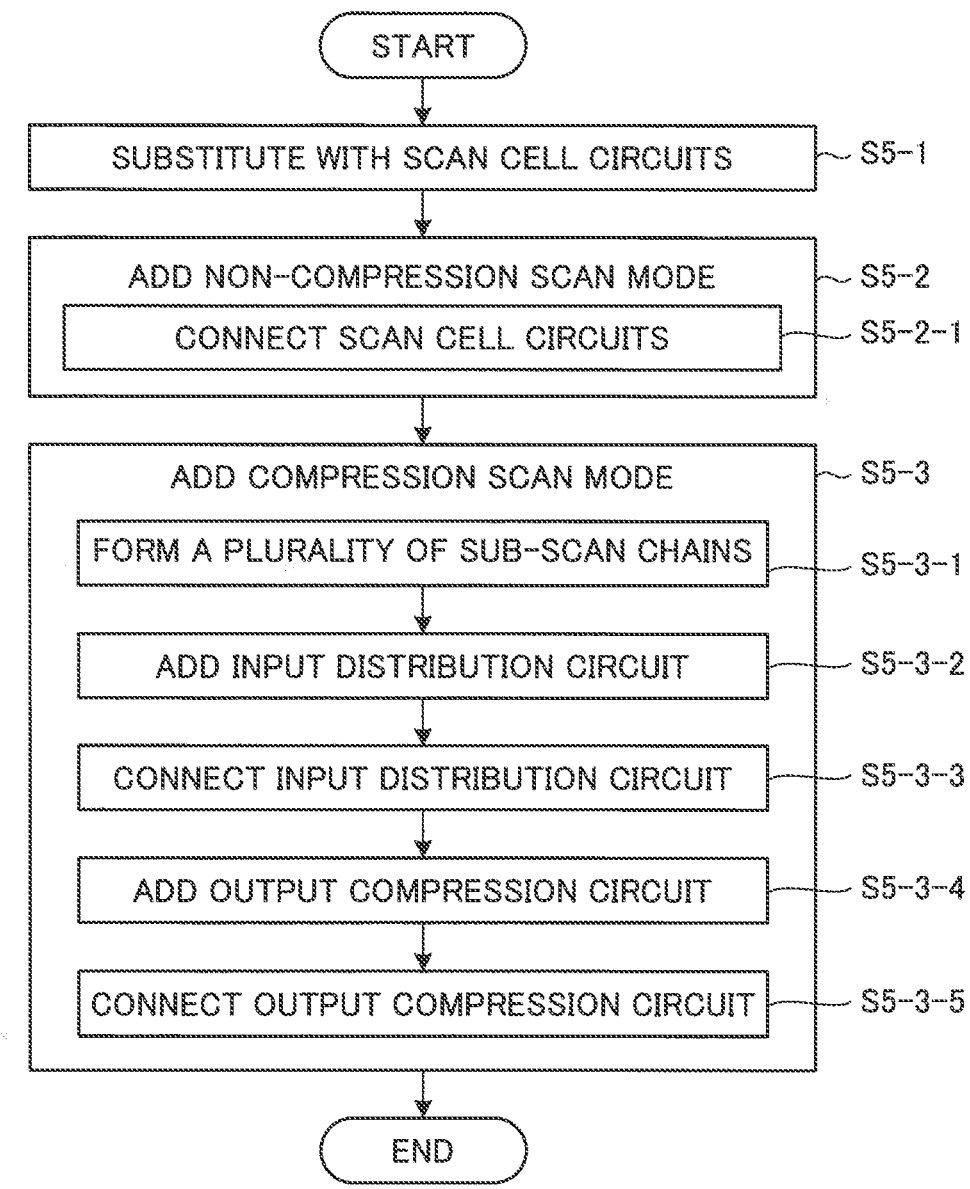
FIG. 3 is an exemplary flow chart representing an insertion process of a scan test circuit.

The insertion process of the scan test circuit is performed by the following steps as illustrated in the flow chart of FIG. 3.

A plurality of flip-flops included in the netlist of the logic circuit are first substituted with a plurality of scan cell circuits (Step S5-1).

Subsequently, a non-compression scan mode is added (Step S5-2).

In this case, for example, scan enable signals are connected to scan enable input terminals of a plurality of scan cell circuits, respectively, and output signals from preceding scan cell circuits are sequentially connected to scan-in input terminals of their succeeding scan cell circuits (Step S5-2-1).

When the scan enable signal is set to the scan test mode, the plurality of scan cell circuits are thus connected in series to form a scan chain.

Subsequently, a compression scan mode is added (Step S5-3).

In this case, for example, the plurality of scan cell circuits making up the scan chain are divided to form a plurality of sub-scan chains (Step S5-3-1).

Subsequently, an input distribution circuit is added (Step S5-3-2).

Subsequently, scan-in signals and scan mode signals are connected to the input distribution circuit, and output signals from the input distribution circuit are connected to scan-in input terminals of the respective first scan cell circuits in the plurality of sub-scan chains (Step S5-3-3).

Subsequently, an output compression circuit is added (Step S5-3-4).

Subsequently, a scan-out signal and a scan mode signal are connected to the output compression circuit, and an output signal from the final scan cell circuit in each of the plurality of sub-scan chains is connected to the output compression circuit (Step S5-3-5).

The procedure is given for illustrative purposes only and the order is subject to change depending on each tool and the circuit structure.

Next, the scan test circuit-designing method according to the invention is described.

Figure 4:
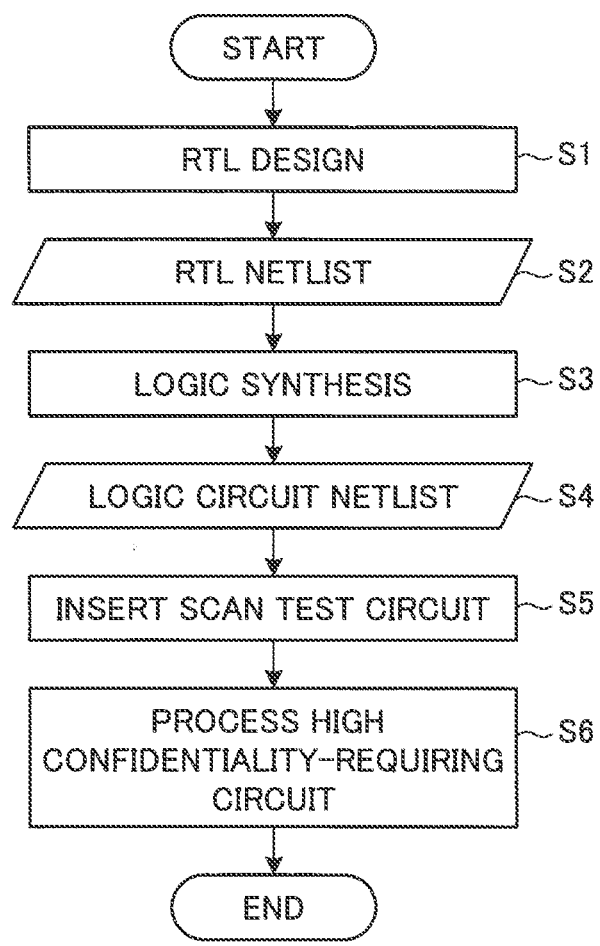
FIG. 4 is a flow chart of an embodiment representing a method of designing the scan test circuit according to the invention.

FIG. 4 is a flow chart of an embodiment representing the scan test circuit-designing method according to the invention. Steps S1 to S5 illustrated in FIG. 4 are the same as those in the conventional scan test circuit-designing method.

In the scan test circuit-designing method according to the invention, subsequently, a tool corresponding to a high confidentiality-requiring circuit is used to perform a process corresponding to the high confidentiality-requiring circuit based on a netlist of a logic circuit into which a scan test circuit is inserted (Step S6).

The process corresponding to the high confidentiality-requiring circuit is performed by the following steps as illustrated in the flow chart of FIG. 5.

The high confidentiality-requiring circuit is first specified from the logic circuit (i.e., logic circuit netlist) having the scan test circuit inserted thereinto based on information on the high confidentiality-requiring circuit such as the hierarchical name in the netlist (Step S6-1).

Subsequently, a scan-in input terminal and a data output terminal of each scan cell circuit included in the logic circuit are specified based on scan-related information including information on the scan-in input terminal and the data output terminal of each scan cell circuit (Step S6-2).

Subsequently, the scan mode signal is confirmed based on the scan-related information (Step S6-3). In this embodiment, the scan mode signal is set to high level in the compression scan mode, and to low level in the non-compression scan mode.

Subsequently, the multiplexer 22 serving as the bypass circuit 18 is added between the scan cell circuit positioned last in the high confidentiality-requiring circuit and its succeeding scan cell circuit (Step S6-4).

Subsequently, based on the polarity of the above-mentioned scan mode signal, an output signal from the circuit preceding the scan cell circuit positioned first in the high confidentiality-requiring circuit, in other words, the first scan cell circuit 20a, and an output signal from the scan cell circuit positioned last in the high confidentiality-requiring circuit are connected to the input terminals 0 and 1 of the multiplexer 22, respectively, and the scan mode signal is connected to the selection input terminal of the multiplexer 22. Further, an output signal from the multiplexer 22 is connected to the scan-in input terminal SI of the circuit succeeding the scan cell circuit positioned last in the high confidentiality-requiring circuit, in other words, the scan cell circuit 20e (Step S6-5).

The scan test circuit 10 is designed by the above-mentioned respective steps.

The specific configurations of the input distribution circuit 14, the output compression circuit 16, and the bypass circuits 18 are not particularly limited but these circuits can be realized by circuits of various configurations that achieve the same functions.

In the example of FIG. 1A, in the case of the compression scan test, the scan chain 12 includes the five sub-scan chains 12a, 12b, 12c, 12d, and 12e. However, the number of the sub-scan chains is not particularly limited. The number of scan chains is also not particularly limited but may be two or more. In the example of FIG. 1A, one high confidentiality-requiring circuit 40 is used. However, the number of high confidentiality-requiring circuits 40 is also not particularly limited but two or more high confidentiality-requiring circuits 40 may be used.

Further, in the example of FIG. 1A, the circuit in the second sub-scan chain 12b that precedes the scan cell circuit 20b positioned first in the high confidentiality-requiring circuit 40 is the first scan cell circuit 20a in the same sub-scan chain 12b. However, when the scan cell circuit positioned first in the high confidentiality-requiring circuit 40 is, for example, the scan cell circuit 20a, the preceding circuit is the final scan cell circuit 20e in the preceding sub-scan chain 12a.

Further, the circuit in the second sub scan chain 12b that succeeds the scan cell circuit 20d positioned last in the high confidentiality-requiring circuit 40 is the final scan cell circuit 20e in the same sub scan chain 12b. However, when the scan cell circuit positioned last in the high confidentiality-requiring circuit 40 is, for example, the scan cell circuit 20c, the circuit succeeding the scan cell circuit 20c is the scan cell circuit 20d in the same sub scan chain 12b.

The position at which the high confidentiality-requiring circuit 40 is disposed is thus not particularly limited but the preceding circuit and the succeeding circuit are appropriately changed according to the position at which the high confidentiality-requiring circuit 40 is disposed.

While the present invention has been described above in detail, the present invention is by no means limited to the foregoing embodiment and it should be understood that various improvements and modifications are possible without departing from the scope and spirit of the present invention.

What is claimed is:

1. A scan test circuit comprising:
a scan chain which comprises a plurality of sub-scan chains formed by connecting respective scan cell circuits in series among a plurality of scan cell circuits included in an internal circuit when a scan enable signal is set to a scan test mode and a scan mode signal is set to a compression scan mode, and which is formed by connecting the plurality of sub-scan chains in series when the scan enable signal is set to the scan test mode and the scan mode signal is set to a non-compression scan mode;
an input distribution circuit which is configured, in the compression scan mode, to input a scan-in signal to be distributed as a distribution signal to a scan-in input terminal in each of scan cell circuits respectively positioned first in the plurality of sub-scan chains, and which is configured, in the non-compression scan mode, to input the scan-in signal to a scan-in input terminal of a scan cell circuit positioned first in a first sub-scan chain, and to sequentially input an output signal from a scan cell circuit positioned last in a preceding sub-scan chain to a scan-in input terminal of a scan cell circuit positioned first in its succeeding sub-scan chain; and
an output compression circuit which is configured to output, in the compression scan mode, a compression signal obtained by compressing output signals from scan cell circuits respectively positioned last in the plurality of sub-scan chains as a scan-out signal, and to output, in the non-compression scan mode, an output signal from a scan cell circuit positioned last in a final sub-scan chain as the scan-out signal;
wherein the scan chain comprises a bypass circuit which is configured in the compression scan mode to connect scan cell circuits of a confidentiality-requiring circuit specified based on information on the confidentiality-requiring circuit which requires confidentiality among the plurality of scan cell circuits included in the internal circuit, thereby forming the plurality of sub-scan chains, and which is configured in the non-compression scan mode to bypass the scan cell circuits of the confidentiality-requiring circuit to form the plurality of sub-scan chains,
wherein the information on the confidentiality-requiring circuit is information on a logic circuit that a scan test is not performed in the non-compression scan mode among the internal circuit, and
wherein the information on the confidentiality-requiring circuit is a hierarchical name of the confidentiality-requiring circuit included in a netlist of the internal circuit.

2. The scan test circuit according to claim 1,
wherein the bypass circuit is switched between the compression scan mode and the non-compression scan mode based on the scan mode signal connected by physical wiring, and
wherein a product of the scan test circuit after manufacture has a structure that does not allow an access to the confidentiality-requiring circuit from outside in the non-compression scan mode.

3. The scan test circuit according to claim 1,
wherein the confidentiality-requiring circuit is a logic circuit that a scan test is performed in the compression scan mode, and the scan test is not performed in the non-compression scan mode among the internal circuit.

4. A scan test method for performing a scan test of an internal circuit using a scan test circuit having a scan test mode including a compression scan mode and a non-compression scan mode, the scan test method comprising:
a step of setting the scan test mode to the compression scan mode and forming a scan chain with a plurality of sub-scan chains formed by connecting respective scan cell circuits in series among a plurality of scan cell circuits included in the internal circuit;
a step of performing the scan test of the internal circuit using the plurality of sub-scan chains and outputting a compression signal obtained by compressing output signals from the plurality of sub-scan chains as a test result;
a step of setting the scan test mode to the non-compression scan mode, forming the plurality of sub-scan chains through connection in which scan cell circuits of a confidentiality-requiring circuit specified by information on the confidentiality-requiring circuit which requires confidentiality are bypassed among the plurality of scan cell circuits included in the internal circuit, and forming the scan chain through serial connection of the plurality of sub-scan chains; and
a step of performing the scan test of the internal circuit except the confidentiality-requiring circuit using the scan chain, and outputting an output signal from the scan chain as the test result,
wherein the information on the confidentiality-requiring circuit is information on a logic circuit that the scan test is not performed in the non-compression scan mode among the internal circuit, and
wherein the information on the confidentiality-requiring circuit is a hierarchical name of the confidentiality-requiring circuit included in a netlist of the internal circuit.

5. The scan test method according to claim 4,
wherein the scan test mode is switched between the compression scan mode and the non-compression scan mode based on a scan mode signal connected by physical wiring, and
wherein a product of the scan test circuit after manufacture does not allow an access to the confidentiality-requiring circuit from outside in the non-compression scan mode.

6. The scan test method according to claim 4,
wherein the confidentiality-requiring circuit is a logic circuit that the scan test is performed in the compression scan mode, and the scan test is not performed in the non-compression scan mode among the internal circuit.

7. A scan test circuit-designing method comprising:
a step of substituting a plurality of flip-flops included in an internal circuit with a plurality of scan cell circuits;
a step of connecting a scan enable signal to a scan enable input terminal in each of the plurality of scan cell circuits and sequentially connecting an output signal from a preceding scan cell circuit to a scan-in input terminal of its succeeding scan cell circuit, thereby forming a scan chain through serial connection of the plurality of scan cell circuits when the scan enable signal is set to a scan test mode;
a step of dividing the plurality of scan cell circuits making up the scan chain to form a plurality of sub-scan chains;
a step of adding an input distribution circuit which is configured to input a scan-in signal to be distributed as a distribution signal to a scan-in input terminal in each of scan cell circuits respectively positioned first in the plurality of sub-scan chains when a scan mode signal is set to a compression scan mode, and which is configured to input the scan-in signal to a scan-in input terminal in a scan cell circuit positioned first in a first sub-scan chain and to sequentially input an output signal from a scan cell circuit positioned last in a preceding sub-scan chain to a scan-in input terminal of a scan cell circuit positioned first in its succeeding sub-scan chain when the scan mode signal is set to a non-compression scan mode;

a step of connecting the scan-in signal and the scan mode signal to the input distribution circuit, and connecting an output signal from the input distribution circuit to the scan-in input terminal in each of the scan cell circuits respectively positioned first in the plurality of sub-scan chains;

a step of adding an output compression circuit which is configured to output, in the compression scan mode, a compression signal obtained by compressing output signals from scan cell circuits respectively positioned last in the plurality of sub-scan chains as a scan-out signal, and to output, in the non-compression scan mode, an output signal from a scan cell circuit positioned last in a final sub-scan chain as the scan-out signal;

a step of connecting the scan-out signal and the scan mode signal to the output compression circuit, and connecting the output signals from the scan cell circuits respectively positioned last in the plurality of sub-scan chains to the output compression circuit;

a step of specifying a confidentiality-requiring circuit in the internal circuit based on information on the confidentiality-requiring circuit which requires confidentiality;

a step of adding a bypass circuit which is configured in the compression scan mode to connect scan cell circuits of the confidentiality-requiring circuit to form the plurality of sub-scan chains, and which is configured in the non-compression scan mode to bypass the scan cell circuits of the confidentiality-requiring circuit and to connect an output signal from a circuit preceding a scan cell circuit positioned first in the confidentiality-requiring circuit to a circuit succeeding a scan cell circuit positioned last in the confidentiality-requiring circuit, thus forming the plurality of sub-scan chains; and a step of connecting the output signal from the circuit preceding the scan cell circuit positioned first in the confidentiality-requiring circuit, an output signal from the scan cell circuit positioned last in the confidentiality-requiring circuit, and the scan mode signal to the bypass circuit, and connecting an output signal from the bypass circuit to the circuit succeeding the scan cell circuit positioned last in the confidentiality-requiring circuit;

wherein the information on the confidentiality-requiring circuit is information on a logic circuit that a scan test is not performed in the non-compression scan mode among the internal circuit, and wherein the information on the confidentiality-requiring circuit is a hierarchical name of the confidentiality-requiring circuit included in a netlist of the internal circuit.

8. The scan test circuit-designing method according to claim 7, wherein in the step of connecting the scan mode signal to the bypass circuit, the scan mode signal is connected by physical wiring so that the scan test mode is switched between the compression scan mode and the non-compression scan mode based on the scan mode signal, and wherein a product of a scan test circuit after manufacture has a structure that does not allow an access to the confidentiality-requiring circuit from outside in the non-compression scan mode.

9. The scan test circuit-designing method according to claim 7, wherein the confidentiality-requiring circuit is a logic circuit that a scan test is performed in the compression scan mode, and the scan test is not performed in the non-compression scan mode among the internal circuit.

\* \* \* \* \*